United States Patent
Wu

(10) Patent No.: US 9,600,043 B2
(45) Date of Patent: Mar. 21, 2017

(54) SIGNAL INPUT DEVICE

(71) Applicants: Inventec (Pudong) Technology Corporation, Shanghai (CN); INVENTEC CORPORATION, Taipei (TW)

(72) Inventor: Fu-Jung Wu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 20 days.

(21) Appl. No.: 14/687,421

(22) Filed: Apr. 15, 2015

(65) Prior Publication Data

US 2016/0157383 A1    Jun. 2, 2016

(30) Foreign Application Priority Data

Nov. 27, 2014   (CN) .......................... 2014 1 0710631

(51) Int. Cl.
*G06F 1/20*     (2006.01)
*H05K 7/20*    (2006.01)

(52) U.S. Cl.
CPC ................ *G06F 1/203* (2013.01); *G06F 1/20* (2013.01); *H05K 7/20145* (2013.01)

(58) Field of Classification Search
CPC ....................... H05K 7/20136; H05K 7/20145
USPC ................. 361/695, 679.49–679.51, 679.09; 454/184; 312/236; 174/547–548
See application file for complete search history.

(56) References Cited

U.S. PATENT DOCUMENTS

| | | | | |
|---|---|---|---|---|
| 5,694,294 A * | 12/1997 | Ohashi | ..................... | G06F 1/203 361/679.48 |
| 5,805,417 A * | 9/1998 | Nakagawa | .............. | G06F 1/203 361/679.09 |
| 6,430,042 B1 * | 8/2002 | Ohashi | ..................... | G06F 1/203 165/104.33 |
| 6,496,369 B2 * | 12/2002 | Nakamura | ............ | G06F 1/1616 165/80.3 |
| 6,570,760 B1 * | 5/2003 | Wang | ..................... | G06F 1/203 257/E23.099 |
| 8,422,224 B2 * | 4/2013 | Tanaka | ..................... | G06F 1/203 165/104.33 |
| 9,098,234 B2 * | 8/2015 | Fujiwara | ............... | G06F 1/1601 |
| 2002/0105783 A1 * | 8/2002 | Kitahara | ............... | G06F 1/1632 361/695 |
| 2006/0002081 A1 * | 1/2006 | Hongo | .................... | G06F 1/203 361/691 |
| 2007/0019373 A1 * | 1/2007 | Yokote | .................. | G06F 1/1616 361/679.02 |
| 2008/0180910 A1 * | 7/2008 | Tomioka | ................. | G06F 1/203 361/695 |
| 2010/0238619 A1 * | 9/2010 | Shirasaka | ............... | G06F 1/203 361/679.08 |

(Continued)

*Primary Examiner* — Zachary M Pape
*Assistant Examiner* — Amir Jalali
(74) *Attorney, Agent, or Firm* — Maschoff Brennan

(57) ABSTRACT

A signal input device includes a casing, an input body and a support component. The casing includes at least one air-intake hole. An accommodating space is formed inside the casing. The support component supports the input body. A chamber is formed inside the support component and includes a first through hole and a second through hole. The first through hole is in fluid communication with the outside.

9 Claims, 7 Drawing Sheets

(56) References Cited

U.S. PATENT DOCUMENTS

| | | | |
|---|---|---|---|
| 2011/0279974 A1* | 11/2011 | Fujiwara | G06F 1/1601 |
| | | | 361/692 |
| 2011/0310561 A1* | 12/2011 | Hata | G06F 1/203 |
| | | | 361/697 |
| 2012/0229978 A1* | 9/2012 | Hata | G06F 1/203 |
| | | | 361/695 |
| 2012/0229982 A1* | 9/2012 | Hata | G06F 1/203 |
| | | | 361/697 |
| 2013/0286292 A1* | 10/2013 | Yamaguchi | G06F 1/203 |
| | | | 348/725 |

* cited by examiner

SIGNAL INPUT DEVICE

CROSS-REFERENCE TO RELATED APPLICATIONS

This non-provisional application claims priority under 35 U.S.C. §119(a) on Patent Application No(s). 201410710631.2 filed in China on Nov. 27, 2014, the entire contents of which are hereby incorporated by reference.

BACKGROUND OF THE INVENTION

Technical Field of the Invention

The disclosure relates to a signal input device. More particularly, the disclosure relates to a signal input device with a chamber therein.

Description of the Related Art

Since a new design concept has been established to make an electronic devices become smaller in size and lighter in weight, electronic components inside the electronic devices have developed to be miniaturized accordingly. However, since the electronic components are miniaturized, the electronic components inside the electronic device crowded, and heat generated by the electronic components is difficult to be removed. At a high temperature, the electronic device works unsteadily and ineffectively and the life spans of the electronic components are shortened.

However, the electronic device, such as an input device, usually does not have a good thermal design for dissipating the heat. When a user utilizes the input device, the heat inside the input device is conducted to a surface of the input device where the user input electronic signals. During a long period of time, the surface of the input device is overheated, and it is uncomfortable for the user to input the electronic signals.

Therefore, in order to improve the heat dissipation efficiency of the input device, and prevent the surface of the input device from being overheated, manufacturers try to develop a new input device with better heat dissipation.

SUMMARY OF THE INVENTION

One aspect of the disclosure provides a signal input device which comprises a casing, an input body and a support component. The casing comprises at least one air-intake hole. An accommodating space is formed inside the casing. The support component supports the input body. A chamber is formed inside the support component and has a first through hole and a second through hole. The first through hole is in fluid communication with the outside.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
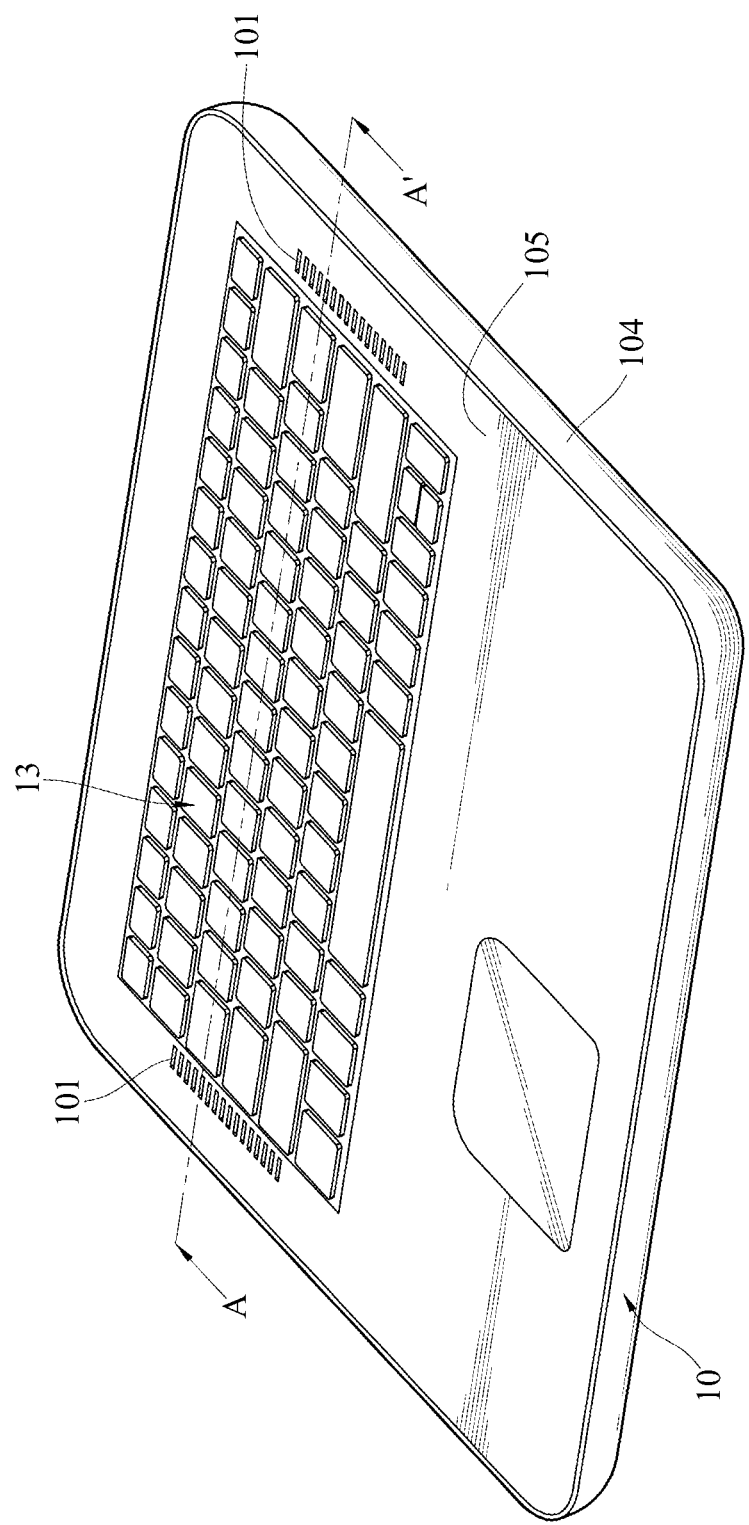
FIG. 1 is a perspective view of a signal input device according to a first embodiment of the disclosure.
Figure 2:
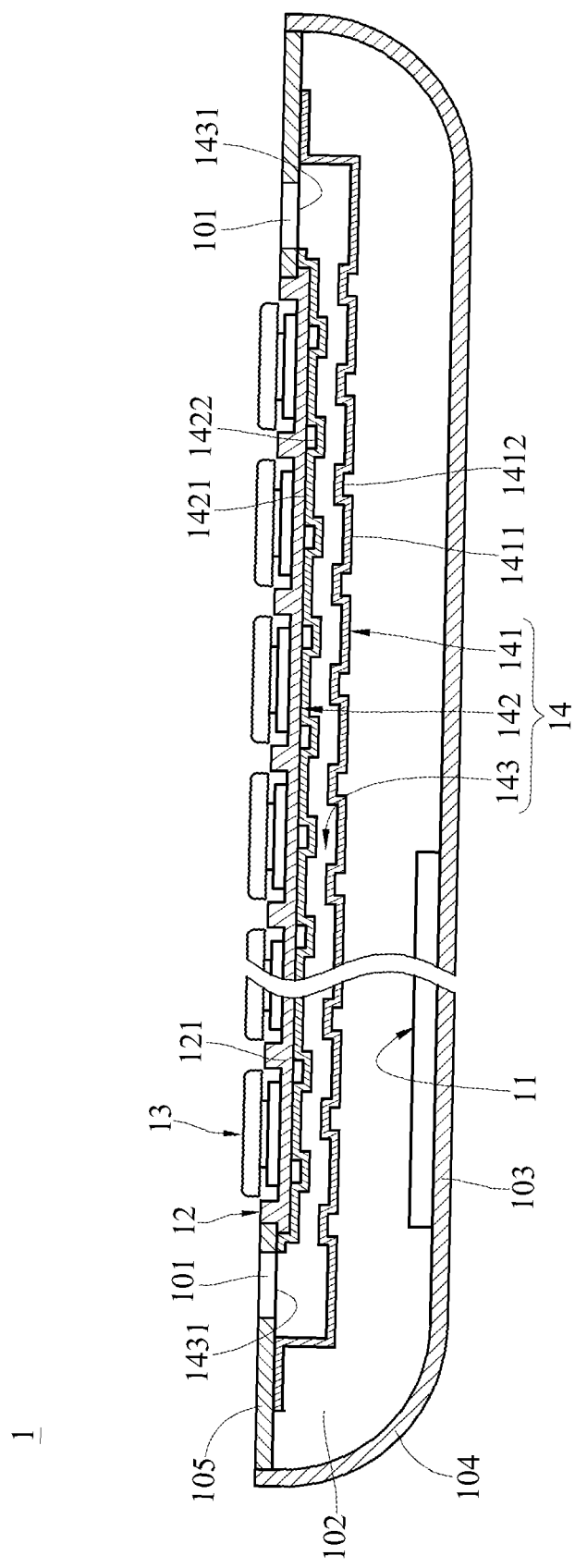
FIG. 2 is a cross-sectional view of the signal input device along a section line AA' in FIG. 1.

Please refer to FIG. 1 and FIG. 2. FIG. 1 is a perspective view of a signal input device according to a first embodiment of the disclosure. FIG. 2 is a cross-sectional view of the signal input device along a section line AA' in FIG. 1. In this embodiment, the signal input device 1 is disposed at an outside space, and comprises a casing 10, a heat source 11, a bearing plate 12, an input body 13 and a support component 14.

The casing 10 has at least one air-intake hole 101. An accommodating space 102 is formed inside the casing 10. The at least one air-intake hole 101 is interconnected with the accommodating space 102. In this embodiment, the casing 10 comprises a bottom plate 103, a side plate 104 and an extension plate 105. Additionally, the quantity of the at least one air-intake hole 101 is two. However, the disclosure is not limited to the quantity of the air-intake holes 101. In other embodiments, for example, the quantity of the air-intake holes 101 are more than or equal to three.

The bottom plate 103 is connected to the side plate 104 of the casing 10. The accommodating space 102 is formed and surrounded by the bottom plate 103 and the side plate 104. The extension plate 105 is connected to the side plate 104 of the casing 10 and covers a part of the accommodating space 102. Moreover, the casing 10 is made of plastic. The two air-intake holes 101 extend through the extension plate 105 of the casing 10, such that the accommodating space 102 is interconnected with the outside space.

The heat source 11 is disposed inside the accommodating space 102 and generates heat when the signal input device 1 is working. In this embodiment, the heat source 11 is a printed circuit board (PCB) equipped with a central processing unit (CPU). However, the heat source 11 is, but not limited to, a PCB. Components which can generate heat while the signal input device 1 working belong to the heat source 11 in the disclosure, and the categories and the working principle are well-known by a person having ordinary knowledge in the art, such that they will not be repeated.

The bearing plate 12 is disposed on the casing 10 and covers the accommodating space 102. In this embodiment, the bearing plate 12 is disposed on the extension plate 105 of the casing 10 and has a slot 121. Additionally, both the bearing plate 12 and the extension plate 105 are made of plastic in this embodiment. However, the bearing plate 12 is not limited to be made of plastic. In other embodiments, for example, the bearing plate 12 is made of metal, for enhancing the structural strength of the bearing plate 12.

The input body 13 is disposed on the bearing plate 12. In this embodiment, the input body 13 is disposed on the slot 121 of the bearing plate 12, and extends outward from the bearing plate 12. Accordingly, it is convenient for a user to input at least one electronic signal. Furthermore, the two air-intake holes 101 are located at two sides of the input body 13 that are opposite to each other. However, the two air-intake holes 101 are not limited to be located at two sides of the input body 13 that are opposite to each other. In other embodiments, for example, the two air-intake holes 101 are located at one side of the input body 13 at the same time. Thus, the disclosure is not limited to above-mentioned relative positions of each air-intake hole 101 and input body 13.

The support component 14 is located between the bearing plate 12 and the bottom plate 103. In other words, the bearing plate 12 is located between the input body 13 and the support component 14. The support component 14 has a first surface 141, a second surface 142 and a chamber 143. The first surface 141 faces toward the bottom plate 103 of the casing 10, and the first surface 141 comprises a first protruding part 1411 and a first recess part 1412. The second surface 142 faces oppositely to the first surface 141, and the second surface 142 comprises a second protruding part 1421 and a second recess part 1422. The first recess part 1412 is parallel to the second protruding part 1421. Furthermore, the structural strength of the support component 14 can be enhanced by the structures of the first protruding part 1411, the second protruding part 1421 (which are like ribs), the first recess part 1412 and the second recess part 1422 (which are like grooves). The chamber 143 has two first through holes 1431 which are interconnected with the two air-intake holes 101, and in fluid communication with the outside space. In this embodiment, the support component 14 is made of metal.

The configuration of the signal input device 1 is described as above-mentioned. Moreover, how to remove the heat generated by the heat source 11 from the signal input device 1 is described as follows.

Figure 3:
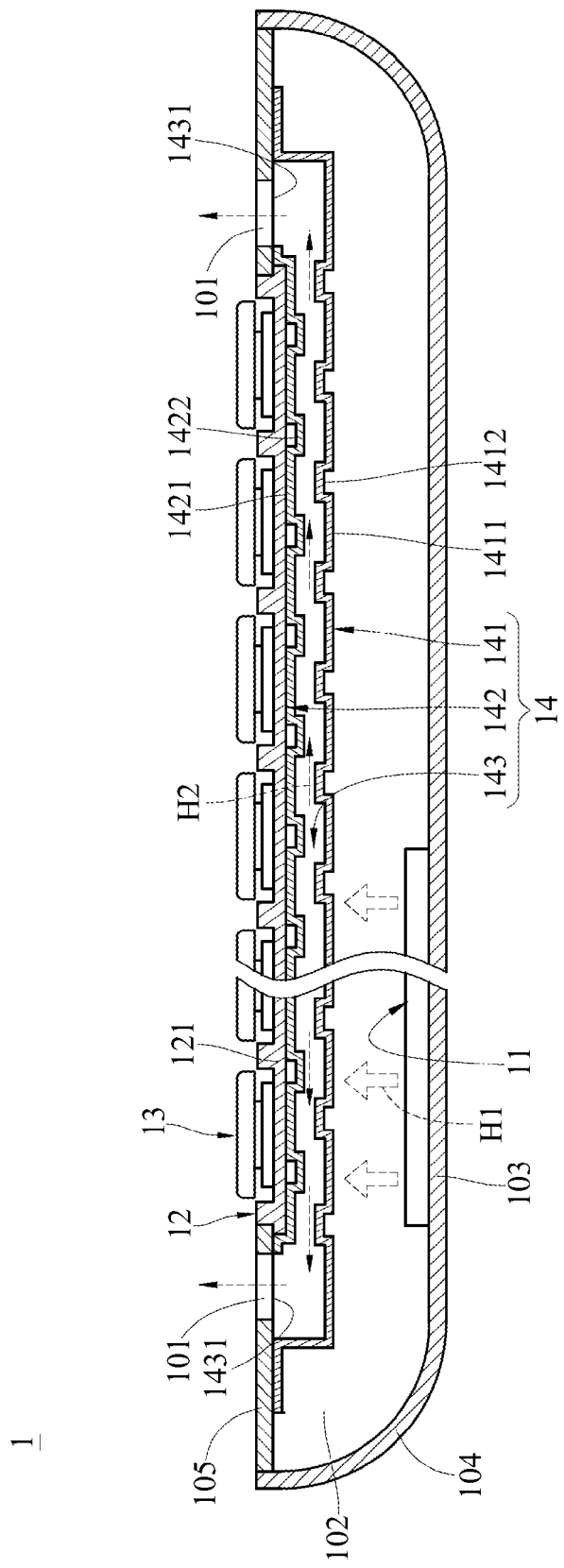
FIG. 3 is a schematic view of the signal input device during heat dissipation according to the first embodiment of the disclosure.

Please refer to FIG. 3, which is a schematic view of the signal input device during heat dissipation according to the first embodiment of the disclosure. When the signal input device 1 works, the heat source 11 generates the heat and further generates at least one first thermal current H1. The first thermal current H1 flows upward and is in thermal contact with the first surface 141 of the support component 14.

When the first thermal current H1 is in thermal contact with the first surface 141 of the support component 14, heat of the at least one first thermal current H1 is conducted toward the chamber 143 via the support component 14 (since the support component 14 is made of metal in this embodiment). Then, at least one second thermal current H2 is generated inside the chamber 143. Since the chamber 143 is filled with air taken as a heat insulator and the chamber 143 is interconnected with the outside space via the two first through holes 1431 and the two air-intake holes 101, the second thermal current H2 flows toward the two first through holes 1431 and the two air-intake holes 101.

Finally, the second thermal current H2 flows outward to the outside space via each air-intake hole 101. Accordingly, the heat generated by the heat source 11 is removed from the signal input device 1 without being in thermal contact with the input body 13.

Figure 4:
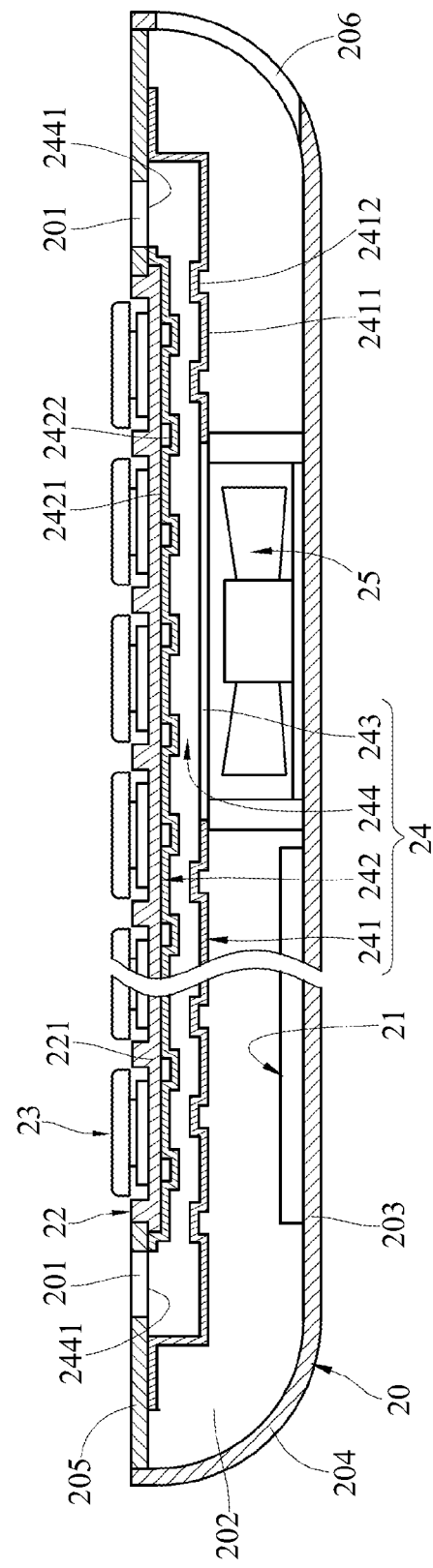
FIG. 4 is a cross-sectional view of a signal input device according to a second embodiment of the disclosure.

Please refer to FIG. 4, which is a cross-sectional view of a signal input device according to a second embodiment of the disclosure. As shown in FIG. 4, in this embodiment, the signal input device 2 is also disposed at an outside space, and comprises a casing 20, a heat source 21, a bearing plate 22, an input body 23 and a support component 24 and a fan 25.

The casing 20 has at least one air-intake hole 201 and an air vent hole 206. An accommodating space 202 is formed inside the casing 20. The at least one air-intake hole 201 is interconnected with the accommodating space 202. In this embodiment, the casing 20 comprises a bottom plate 203, a side plate 204 and an extension plate 205. Additionally, for example, the quantity of the at least one air-intake hole 201 is two.

The bottom plate 203 is connected to the side plate 204 of the casing 20. The accommodating space 202 is formed and surrounded by the bottom plate 203 and the side plate 204. The extension plate 205 is connected to the side plate 204 of the casing 20 and covers a part of the accommodating space 202. Moreover, the casing 20 is made of plastic. The two air-intake holes 201 extend through the extension plate 205 of the casing 20. The air vent hole 206 is located at and extend through the side plate 204. The two air-intake holes 201 and the air vent hole 206 are interconnected with the accommodating space.

The heat source 21 is disposed inside the accommodating space 202 and generates heat when the signal input device 2 is working. In this embodiment, the heat source 21 is also a PCB equipped with a CPU.

The bearing plate 22 is disposed on the casing 20 and covers the accommodating space 202. In this embodiment, the bearing plate 22 is disposed on the extension plate 205 of the casing 20 and has a slot 221. Additionally, both the bearing plate 22 and the extension plate 205 are made of plastic in this embodiment.

The input body 23 is disposed on the bearing plate 22. In this embodiment, the input body 23 is disposed on the slot 221 of the bearing plate 22, and extends outward from the bearing plate 22. Accordingly, it is convenient for the user to input at least one electronic signal. Furthermore, the two air-intake holes 201 are located at two sides of the input body 23 that are opposite to each other.

The support component 24 has a first surface 241, a second surface 242, a second through hole 243 and a chamber 244. The first surface 241 faces toward the casing 20. The second surface 242 faces oppositely to the first surface 241. The second through hole 243 extends through the support component 24.

The support component 24 is located between the bearing plate 22 and the bottom plate 203. In other words, the bearing plate 22 is located between the input body 23 and the support component 24. In this embodiment, the first surface 241 faces toward the bottom plate 203 of the casing 20, and comprises a first protruding part 2411 and a first recess part 2412. The second surface 242 faces oppositely to the first surface 241, and comprises a second protruding part 2421 and a second recess part 2422. The first recess part 2412 is parallel to the second protruding part 2421. The chamber 244 has two first through holes 2441 which are interconnected with the two air-intake holes 201, and in fluid communication with the outside the outside space. In this embodiment, the support component 24 is also made of metal.

The fan 25 with an air inlet hole (not indicated in FIG.) is disposed inside the accommodating space 202, and located between the support component 24 and the bottom plate 203 of the casing 20. In this embodiment, the support component 24 is in contact with the fan 25. The second through hole 243 is interconnected with the air inlet hole of the fan 25. Moreover, the position of the fan 25 is corresponding to the air vent hole 206 of the casing 20. In this embodiment, the fan 25 is a vacuum fan, for driving at least one airflow to enter the chamber 244 from each air-intake hole 201, and to leave from the air vent hole 206 (please refer to FIG. 5 in advance).

The configuration of the signal input device 2 is described as above-mentioned. Moreover, how to remove heat generated by the heat source 21 from the signal input device 2 is described as follows.

Figure 5:
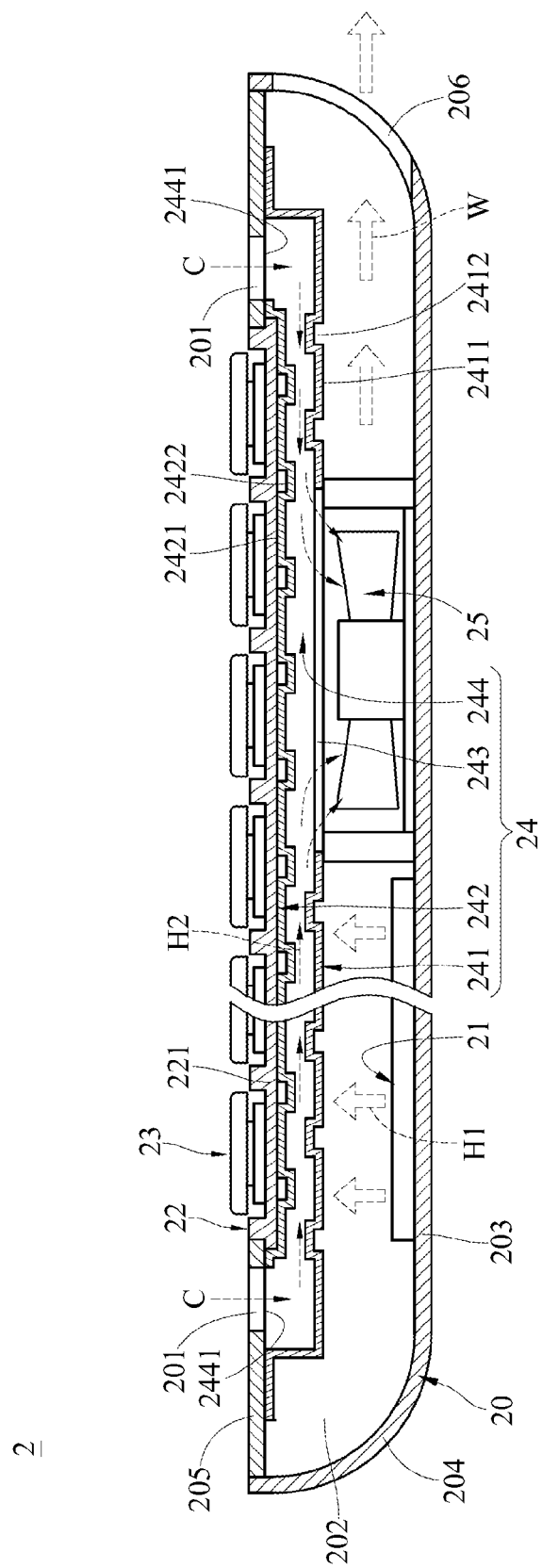
FIG. 5 is a schematic view of the signal input device during heat dissipation according to the second embodiment of the disclosure.

Please refer to FIG. 5, which is a schematic view of the signal input device during heat dissipation according to the second embodiment of the disclosure. When the signal input device 2 works, the heat source 21 generates heat and further generates at least one first thermal current H1. The at least one first thermal current H1 flows upward and in thermal contact with the first surface 241 of the support component 24.

When the first thermal current H1 is in thermal contact with the first surface 241 of the support component 24, heat of the first thermal current H1 is conducted toward the chamber 244 by the support component 24 (since the support component 24 is made of metal in this embodiment). Then, at least one second thermal current H2 is generated inside the chamber 244.

At the same time, the fan 25 drives at least one cold current C to enter the chamber 244 from the two air-intake holes 201 and flows toward the second through hole 243. Since the temperature of the outside space is less than the temperature of the accommodating space 202, the cold current C can cool the temperature inside the signal input device 2 when the cold current C enters the chamber 244. Additionally, the fan 25 also drives the second thermal current H2 to flow toward the second through hole 243.

Finally, a mixture current W (comprising the second thermal current H2 and the cold current C) passes through the second through hole 243, and then leaves the signal input device 2 from the air vent hole 206. In other words, the heat generated by the heat source 21 is removed from the signal input device 2.

Figure 6:
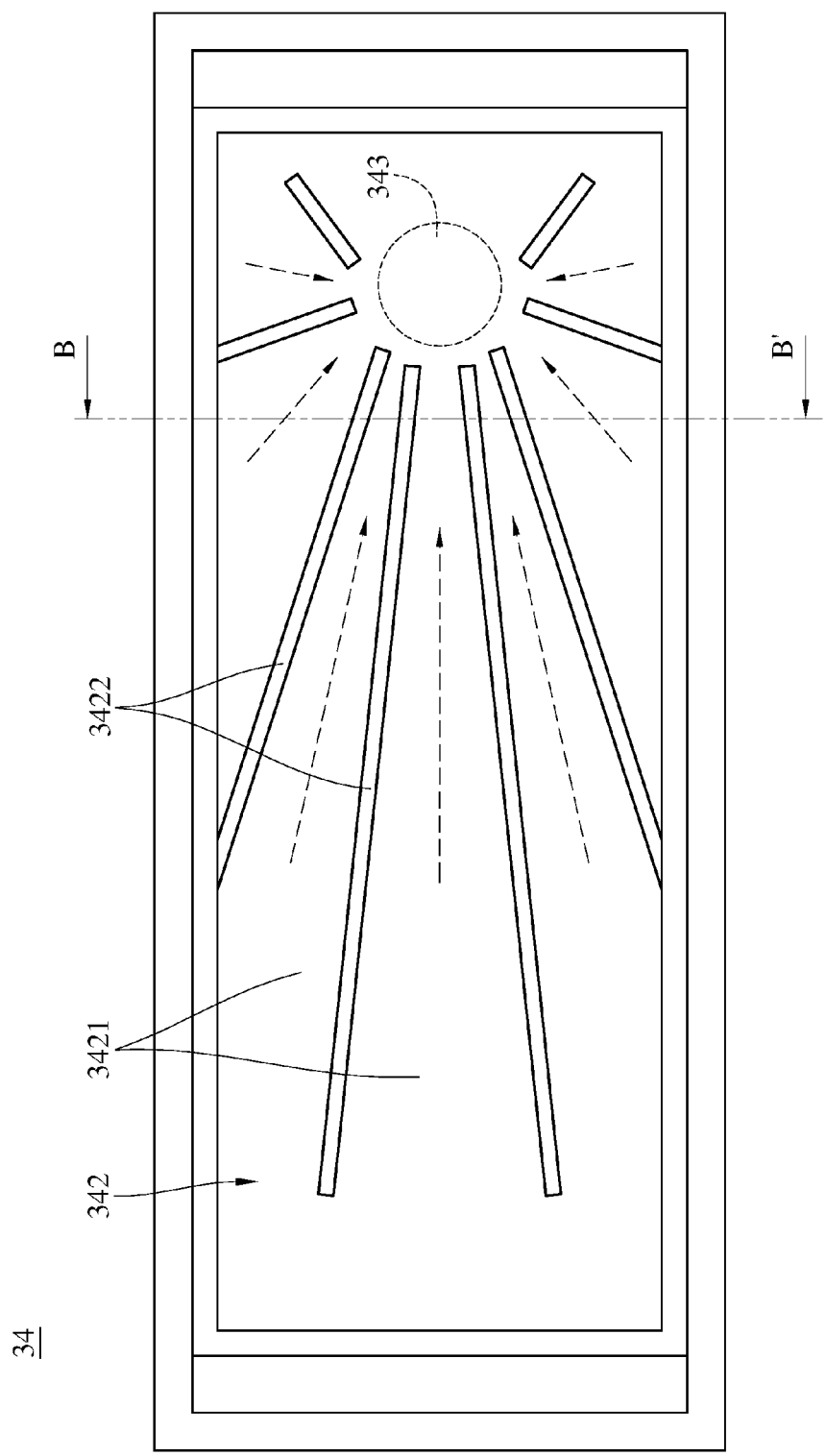
FIG. 6 is a top view of a signal input device according to a third embodiment of the disclosure.
Figure 7:
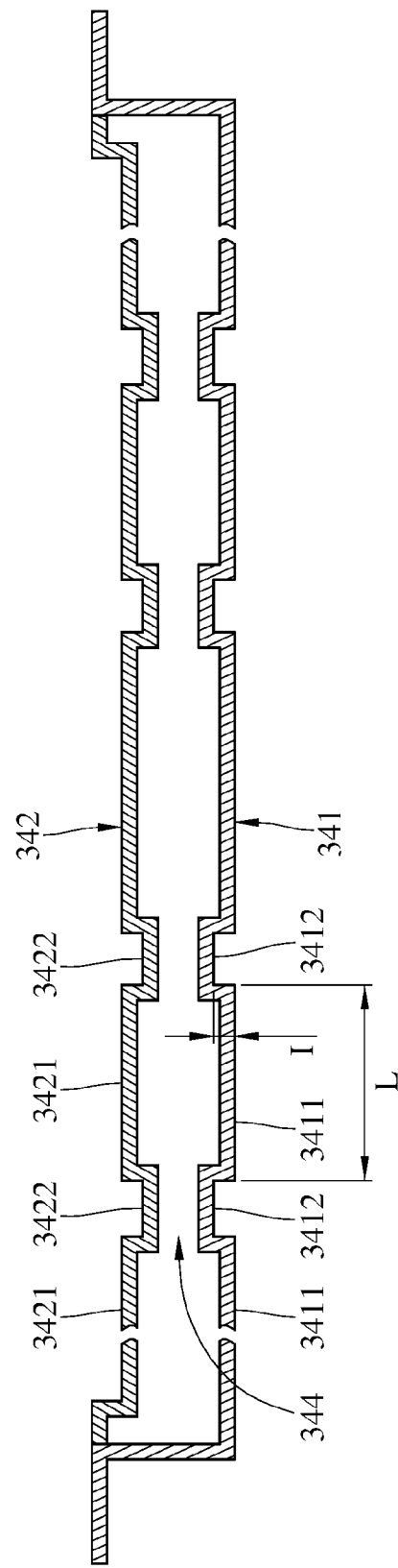
FIG. 7 is a cross-sectional view of the signal input device along a section line B-B' in FIG. 6.

Please refer to FIG. 6 and FIG. 7. FIG. 6 is a top view of a signal input device according to a third embodiment of the disclosure. FIG. 7 is a cross-sectional view of the signal input device along a section line BB' in FIG. 6.

A support component 34 is provided. The support component 34 has a first surface 341 and a second surface 342. The second surface 342 faces oppositely to the first surface 341. The first surface 341 comprises a first protruding part 3411 and a first recess part 3412. The second surface 342 comprises a second protruding part 3421 and a second recess part 3422.

Different from the second embodiment, the first protruding part 3411, the first recess part 3412, the second protruding part 3421 and the second recess part 3422 of the support component 34 are arranged radially in this embodiment. Accordingly, the structural strength of the support component 34 can be enhanced, and the first protruding part 3411, the first recess part 3412, the second protruding part 3421 and the second recess part 3422 are formed as an air guiding groove. In this embodiment, both the cross-sectional surfaces of the first protruding part 3411 and the second protruding part 3421 are rectangles. A length L of each rectangle is between 2 millimeters and 5 millimeters. A width I of each rectangle is between 0.3 millimeters and 0.5 millimeters. However, the disclosure is not limited to the arrangements and the shapes of the first protruding part 3411, the first recess part 3412, the second protruding part 3421 and the second recess part 3422.

When a fan (not shown in FIGs.) works, at least one airflow F inside a chamber 344 flows toward a second through hole 343 along the first protruding part 3411, the first recess part 3412, the second protruding part 3421 and the second recess part 3422. Then, heat generated by a heat source (not shown in FIGs.) can be removed.

Except the arrangements and the shapes of the first protruding part 3411, the first recess part 3412, the second protruding part 3421 and the second recess part 3422, other components or conditions, which are not mentioned in this embodiment, are similar to the second embodiment (please refer to FIG. 4 and FIG. 5), such that they will not be repeated again.

To sum up, according to the disclosure, the signal input device comprises the support component with the chamber. The heat inside the chamber can be removed from the air-intake hole. Additionally, in some embodiments, the signal input device can further comprise the fan and the air vent hole, the fan can drive the at least one airflow to enter the chamber from the air-intake hole, and then to leave the signal input device from the air vent hole. Accordingly, a majority of the heat is transferred to the outside space rather than being conducted to the input body.

The disclosure will become more fully understood from the said embodiment for illustration only and thus does not limit the disclosure. Any modifications within the spirit and category of the disclosure fall in the scope of the disclosure.

What is claimed is:

1. A signal input device, comprising:
    a casing comprising at least one air-intake hole, and an accommodating space being formed inside the casing;
    an input body;
    a support component supporting the input body;
    wherein a chamber is formed inside the support component and comprises a first through hole and a second through hole, the first through hole is in fluid communication with an outside;
    wherein the support component comprises a first surface and a second surface which are opposite to each other, the first surface comprises a first protruding part and a first recess part, the second surface comprises a second protruding part and a second recess part, the first protruding part is parallel to the second recess part, and the first recess part is parallel to the second protruding part;
    wherein the first protruding part, the second recess part, the first recess part and the second protruding part are arranged radially; and
    wherein both the cross-sectional surfaces of the first protruding part and the second protruding part are rectangles, a length of each rectangle is between 2 millimeters and 5 millimeters, and a width of each rectangle is between 0.3 millimeters and 0.5 millimeters.

2. The signal input device according to claim 1, wherein the first through hole is interconnected with the at least one air-intake hole.

3. The signal input device according to claim 1, further comprising a fan disposed inside the accommodating space.

4. The signal input device according to claim 3, wherein the support component is in contact with the fan, the fan comprises an air inlet hole, and the second through hole is interconnected with the air inlet hole of the fan.

5. The signal input device according to claim 1, further comprising a bearing plate disposed between the support component and the input body.

6. The signal input device according to claim 5, wherein the casing comprises a bottom plate, a side plate and an extension plate, the bottom plate is connected to the side plate, the accommodating space is surrounded by the bottom plate and the side plate, the extension plate is connected to the side plate, and the bearing plate is disposed on the extension plate.

7. The signal input device according to claim 6, wherein the at least one air-intake hole is located at one side of the input body and extends through the extension plate.

8. The signal input device according to claim 6, wherein the casing further comprises an air vent hole located at the side plate and interconnected with the accommodating space.

9. The signal input device according to claim 1, wherein a quantity of the at least one air-intake hole is two, and the two air-intake holes are located at two sides of the input body that are opposite to each other.

* * * * *